United States Patent
Bawa

(10) Patent No.: US 10,057,020 B2
(45) Date of Patent: Aug. 21, 2018

(54) JOINT ESTIMATION OF COEFFICIENTS FOR SKEW, GAIN IMBALANCE AND CHANNEL RESPONSE FOR SIGNAL SOURCES

(71) Applicant: TEKTRONIX, INC., Beaverton, OR (US)

(72) Inventor: Iqbal Gadugal Bawa, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/268,981

(22) Filed: Sep. 19, 2016

(65) Prior Publication Data

US 2017/0149539 A1 May 25, 2017

Related U.S. Application Data

(60) Provisional application No. 62/257,612, filed on Nov. 19, 2015.

(51) Int. Cl.
*H04L 1/20* (2006.01)
*H04L 1/24* (2006.01)
(Continued)

(52) U.S. Cl.
CPC .......... *H04L 1/205* (2013.01); *H04L 1/244* (2013.01); *H04L 5/0048* (2013.01); *H04L 25/49* (2013.01); *H04L 27/265* (2013.01)

(58) Field of Classification Search
USPC ............................ 375/222, 226, 346, 224
See application file for complete search history.

(56) References Cited

U.S. PATENT DOCUMENTS

| | | | |
|---|---|---|---|
| 2004/0095995 A1* | 5/2004 | Matreci | H04L 27/364 375/224 |
| 2005/0024244 A1 | 2/2005 | Asami | |

(Continued)

OTHER PUBLICATIONS

Georgiadis et al., "Evaluation of error vector magnitude due to combined IQ imbalances and phase noise", IET Circuits Devices and Systems, Nov. 1, 2014, pp. 421-426, vol. 8-No. 6, The Institution of Engineering and Technology, GB.

(Continued)

*Primary Examiner* — Eva Puente
(74) *Attorney, Agent, or Firm* — Marger Johnson; Kevin D. Dothager

(57) ABSTRACT

A test and measurement system includes a signal creation tool to generate a complex-valued stimulus signal, at least one waveform generator to receive the stimulus signal and produce at least one pair of baseband signals, a test instrument to capture the at least one pair of baseband signals and produce captured baseband signals, a pre-compensation coefficients estimation block to receive the captured baseband signals, characterize the captured baseband signals and to generate pre-compensation coefficients, and a pre-compensation block to apply the pre-compensation coefficients to the complex-valued stimulus signal when there is a device under test.

A method of characterizing a test system includes generating a multi-tone stimulus signal, producing at least one pair of baseband signals form the multi-tone stimulus signal, capturing the at least one pair of baseband signals with a test instrument, characterizing the at least one pair of baseband signals to generate pre-compensation coefficients, and applying the pre-compensation coefficients to signals applied to a device under test.

14 Claims, 5 Drawing Sheets

(51) Int. Cl.
*H04L 5/00* (2006.01)
*H04L 25/49* (2006.01)
*H04L 27/26* (2006.01)

(56) References Cited

U.S. PATENT DOCUMENTS

| | | | |
|---|---|---|---|
| 2005/0047536 A1* | 3/2005 | Wu | H04L 27/3863 |
| | | | 375/346 |
| 2007/0070691 A1* | 3/2007 | Walvis | H04L 27/2601 |
| | | | 365/185.03 |
| 2007/0286307 A1 | 12/2007 | Hayashi et al. | |
| 2009/0316589 A1* | 12/2009 | Shafeeu | H04L 27/364 |
| | | | 370/252 |
| 2014/0241410 A1* | 8/2014 | Dark | H04B 1/12 |
| | | | 375/226 |
| 2014/0254644 A1* | 9/2014 | Gotman | H04L 27/01 |
| | | | 375/222 |
| 2015/0241494 A1 | 8/2015 | Miyanaga et al. | |

OTHER PUBLICATIONS

European Patent Office, Extended European Search Report and Written Opinion for European Patent Application 16199506, dated Mar. 16, 2017, 8 pages, European Patent Office, Munich, Germany.

* cited by examiner

JOINT ESTIMATION OF COEFFICIENTS FOR SKEW, GAIN IMBALANCE AND CHANNEL RESPONSE FOR SIGNAL SOURCES

CROSS REFERENCE TO RELATED APPLICATIONS

This application claims benefit of, and priority to, U.S. Provisional Application No. 62/257,612, "JOINT ESTIMATION OF COEFFICIENTS FOR SKEW, GAIN IMBALANCE AND CHANNEL RESPONSE FOR SIGNAL SOURCES," filed Nov. 19, 2015, which is incorporated by reference herein in its entirety.

TECHNICAL FIELD

This disclosure relates to baseband testing on devices under test, more particularly to pre-distortion coefficients used to filter the baseband signal.

BACKGROUND

With the advancements in Digital Sampling and Semiconductor technology, Arbitrary Waveform Generators (AWGs) with high sampling rate Digital to Analog Converters (50 GS/s and 25 GS/s) have become available on the market. These high bandwidth AWGs can create wide bandwidth IQ (baseband) signals required for coherent optical signal communication receiver testing, where I represents the in-phase signal and Q represents the quadrature signal.

AWGs that generate test signals for wide band applications such as optical communication are ideally required to have a flat magnitude and linear phase frequency response in the band of interest. In addition to flatness, skew and gain between the I and Q channels must be matched when testing wideband IQ signals. The quality of a digitally modulated signal is measured using Error Vector Magnitude (EVM). Any distortion in the signals due to skew or gain mismatches between the I and Q channels will increase the signal's EVM, indicating that the digitally modulated signal has poor quality.

The test signal must undergo de-embedding or pre-compensating for any magnitude distortions, phase distortions, or skew and gain imbalance introduced by the test setup before being used to qualify a Device Under Test (DUT). Typically, pre-distortion coefficients are determined before testing a DUT, and may be used to de-embed or pre-compensate the test signal during testing.

One method used to obtain the pre-distortion coefficients is a two-step process, wherein the frequency response of each of I and Q channels are measured independently. The frequency response is then inverted and two real-valued pre-distortion coefficients are obtained. These pre-distortion coefficients can be used by correction filters which are applied on the I and Q signals separately.

Another method obtains complex pre-distortion coefficients by directly measuring the complex frequency response of the I and Q signals.

The main disadvantage of the above methods lies in that they obtain frequency responses without considering the skew and magnitude imbalance between the channels. The skew and magnitude have a significant role in degradation of EVM of the signals. For example, measuring the complex frequency response without correcting for skew imbalances between the channels may result in incorrect phase measurements.

To obtain the skew and gain imbalance, another prior art method may be used. For example, a known signal such as a step signal or a sinusoidal signal may be generated simultaneously from both the I and Q channels. The skew and gain imbalances between the channels are measured manually and corrected by either mathematically shifting and scaling one of the signals, or changing the clock phase between the AWGs and the amplitude control of the channels.

One drawback of this prior art method results from the user having to manually obtain the skew and gain correction values. This often becomes a time consuming method of trial-and-error, and prone to user measurement errors.

Automated methods exist to synchronize and adjust the skew between AWG channels, but they do not account for distortions caused by cables running to the Device Under Test (DUT). Currently, no methods are known for automatically adjusting gain imbalances between the channels.

SUMMARY

An embodiment consists of a test and measurement system that has a signal creation tool to generate a complex-valued stimulus signal, at least one waveform generator to receive the stimulus signal and produce at least one pair of baseband signals, a test instrument to capture the at least one pair of baseband signals and produce captured baseband signals, a pre-compensation coefficients estimation block to receive the captured baseband signals, characterize the captured baseband signals and to generate pre-compensation coefficients, and a pre-compensation block to apply the pre-compensation coefficients to the complex-valued stimulus signal when there is a device under test.

Another embodiment consists of a method of characterizing a test system that includes generating a multi-tone stimulus signal, producing at least one pair of baseband signals form the multi-tone stimulus signal, capturing the at least one pair of baseband signals with a test instrument, characterizing the at least one pair of baseband signals to generate pre-compensation coefficients, and applying the pre-compensation coefficients to signals applied to a device under test.

DETAILED DESCRIPTION OF THE EMBODIMENTS

Figure 1:
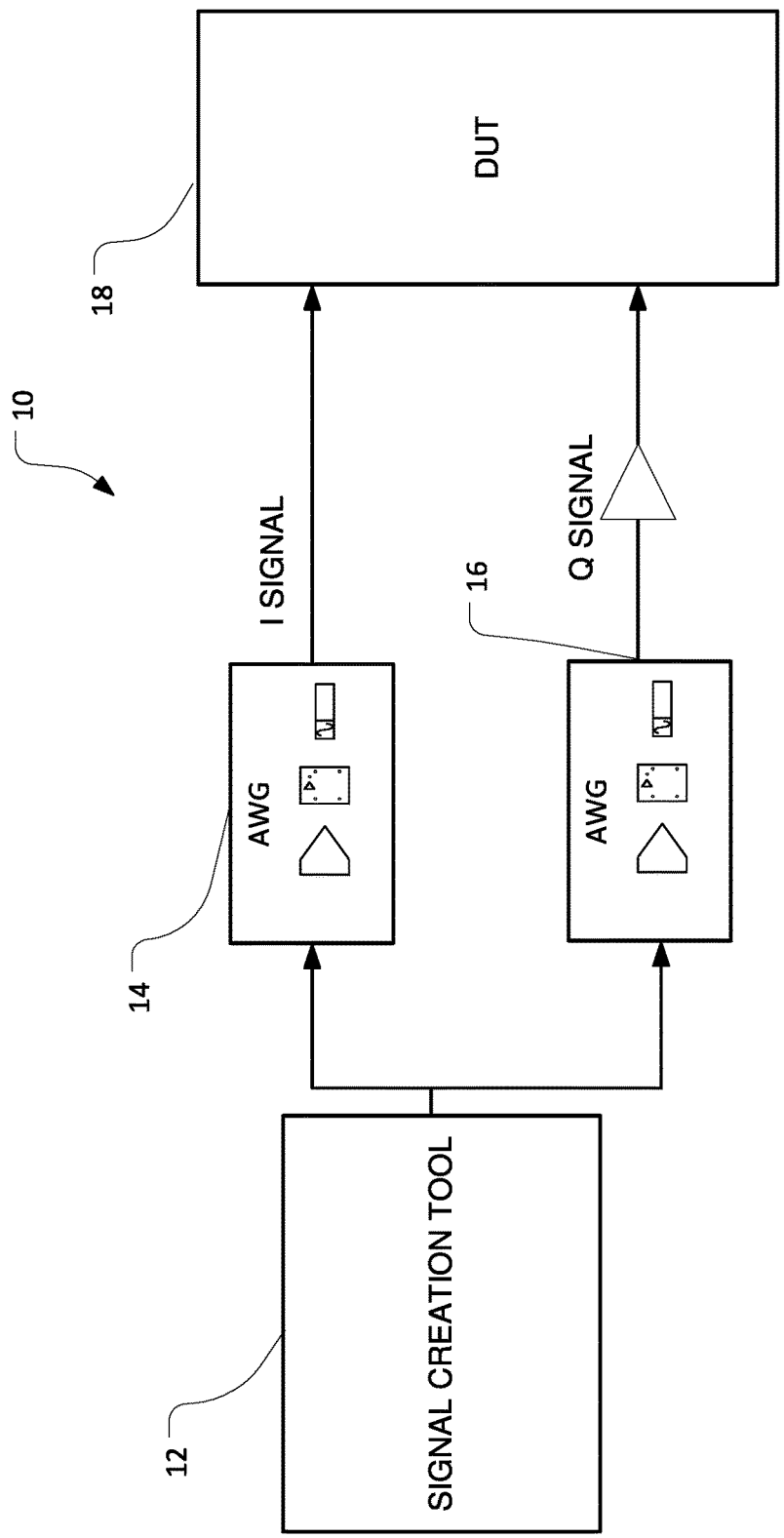
FIG. 1 shows a prior art baseband test setup.

FIG. 1 shows an exemplary prior art system 10 for performing baseband testing on a device under test ("DUT") 18 using two AWG channels. The AWGs receive a generated signal from the signal creation tool 12 and produce two signals one for the I channel or signal, and one for the Q channel or signal. Although FIG. 1 shows separate AWGs 14 and 16 for each channel, a single AWG with two channels may also be used. AWGs that generate test signals for wide band applications such as optical communication are ideally required to have a flat magnitude and linear phase frequency response in the band of interest. In addition to flatness, skew and gain between the I and Q channels must be matched when testing wideband IQ signals. The quality of a digitally modulated signal is measured using Error Vector Magnitude (EVM). Any distortion in the signals due to skew or gain mismatches between the I and Q channels will increase the signal's EVM.

Figure 2:
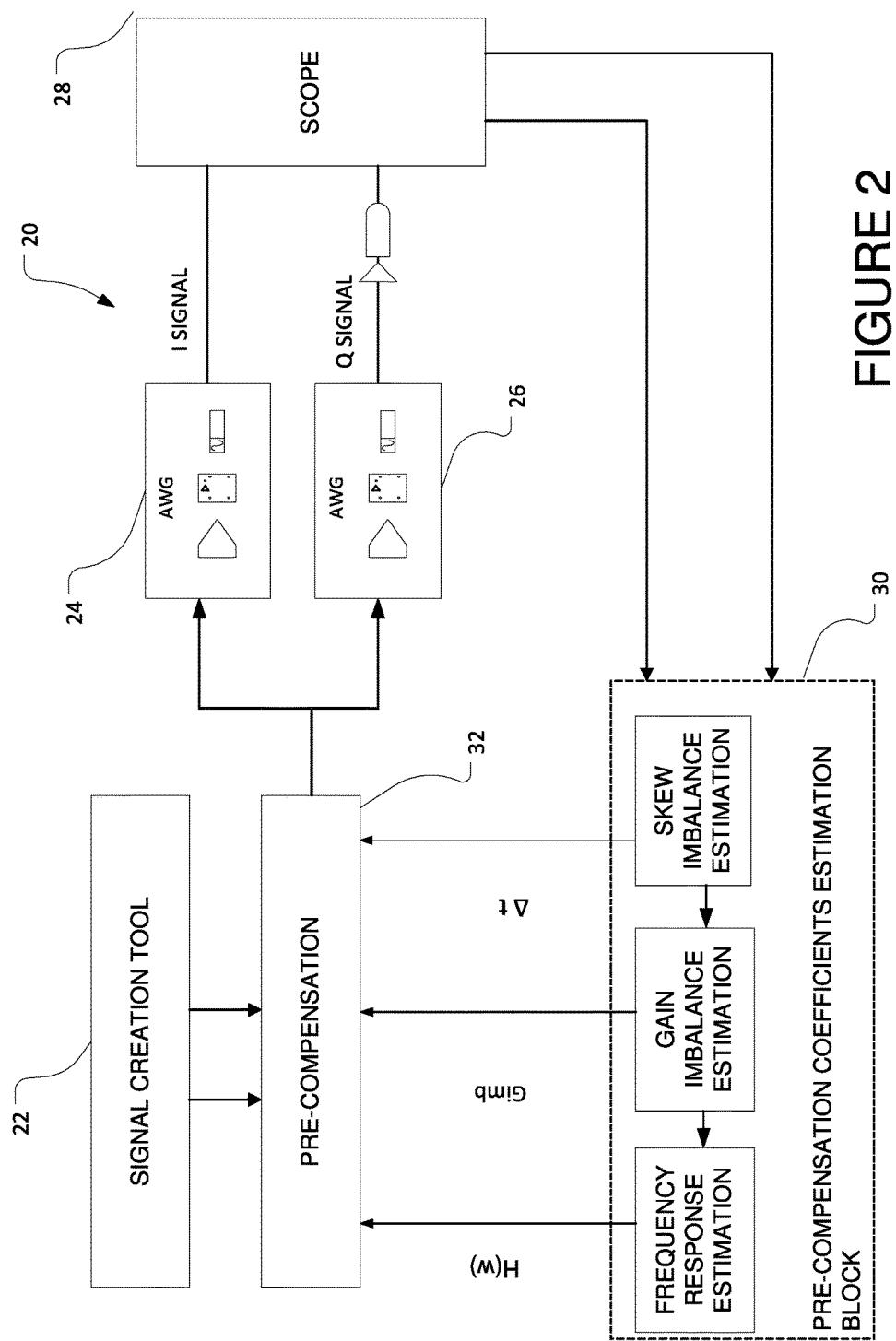
FIG. 2 shows an embodiment of a system to jointly calculate skew and gain imbalances and obtaining a frequency response of each channel.

The current embodiments disclose a method to jointly obtain the frequency response of each channel, and calculate the skew and the gain imbalances between the channels by using a single complex multi-tone signal as a stimulus. Though the rest of this document describes using one or more AWGs as the signal source, the disclosed method can be extended to any device capable of generating a baseband signal. FIG. 2 shows an exemplary system 20 for jointly calculating skew and gain imbalances and obtaining a frequency response of each channel, and FIG. 3 shows a flowchart of an embodiment of a method to determine these measures to perform pre-compensation.

In FIG. 2, the system 20 has a signal creation tool 22, and two AWGs, one 14 for the I channel or signal, and one 16 for the Q channel or signal, a test instrument 28, such as a wideband oscilloscope, a pre-compensation coefficients estimation block 30 and a pre-compensation block 32.

Figure 3:
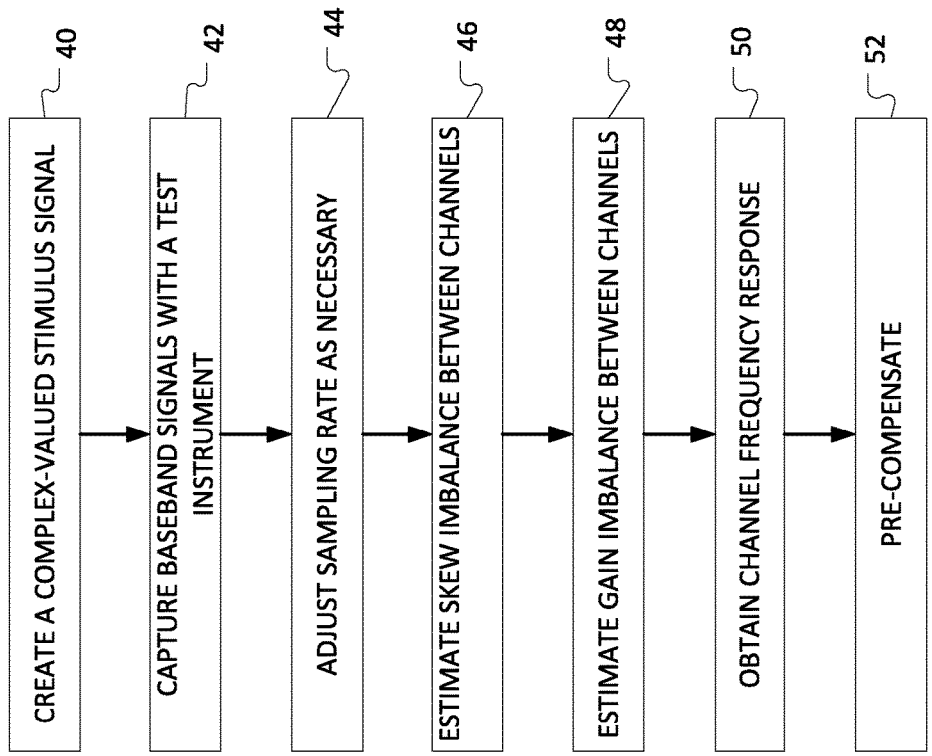
FIG. 3 shows a flowchart of an embodiment of jointly calculating skew and gain imbalances and obtaining a frequency response for baseband signals.

FIG. 3 shows an embodiment of a process to jointly calculate skew and gain imbalances and obtaining a frequency response of each channel using a system such as that in FIG. 2. The signal creation tool 22 of FIG. 2, which may consist of one or more devices capable of generating baseband signals creates a complex-valued stimulus signal at 40. A wideband oscilloscope or other test instrument such as 28 in FIG. 2 then captures the I and Q signals generated by the AWGs 24 and 26 at 42. If necessary, the test instrument adjusts the sampling rate for the captured signals at 44. The pre-compensation coefficients estimation block 30 then estimates the skew imbalance between the channels at 46 and the gain imbalance between the channels at 48. It also obtains the channel frequency response at 50. These measures are then used to generate coefficients for the pre-compensation filter or block 32 of FIG. 2. The pre-compensation block 32 then operates on the incoming signal during operation of the system when it performs testing. When the DUT then undergoes testing, the signal used by the AWGs to produce the I and Q baseband signals will have been pre-compensated for the testing set up, allowing more accurate testing.

Although FIG. 2 depicts two separate AWGs, a single AWG with two separate I and Q channels could also be used. In some embodiments, more than two AWGs could also be used, for example, such as when multiple I and Q channels exist. Each of the signal creation tool 22, the pre-compensation block 32, and the pre-compensation coefficients estimation block 30 may be implemented by one or more of the AWGs 24 and 26, by the scope 28, or by another instrument or a device such as a general-purpose computer.

As discussed at 40 in FIG. 3, a signal creation took generates a complex-valued multi-tone signal as a stimulus signal. The phases of the tones within the stimulus signal are chosen to have a good Peak to Average Power Ratio (PAPR). This is to make sure the full dynamic range of the AWG's Digital to Analog Converter (DAC) is used. In one embodiment, the signal creation tool uses either Newman phases or a combination of pseudo-random binary sequences (PRBS) used in standard wireless communication for channel estimation. An example stimulus signal may be described by the following equations:

$$s(n) = \sum_{m=1}^{Nt} \exp\left(j\left(\frac{2*\pi*n*f_m}{Fs}\right) + \phi_m\right)$$

$$s(n) = \sum_{m=1}^{Nt} \left(\cos\left(\frac{\cos(2*\pi*n*f_m)}{Fs}\right) + j\sin\left(\frac{2*\pi*n*f_m}{Fs}\right)\right);$$

where Nt is the number of tones, and Fs is the AWG's sampling rate. If two or more baseband signal generating devices are used, Fs represents the common sampling rate for all generating devices.

In this case, s(n) is a complex-valued waveform, wherein the real part of s(t) is generated from an I channel, and the imaginary part of s(t) is generated from a Q channel.

The 'I' & 'Q' outputs of the AWG/AWGs are then captured on two or more channels of an instrument such as a wideband oscilloscope, where both the channels are triggered at the same time. To ensure an accurate measurement, the instrument must be well calibrated and any skew or gain imbalances between the instrument's channels must have been corrected prior to characterization.

Figure 4:
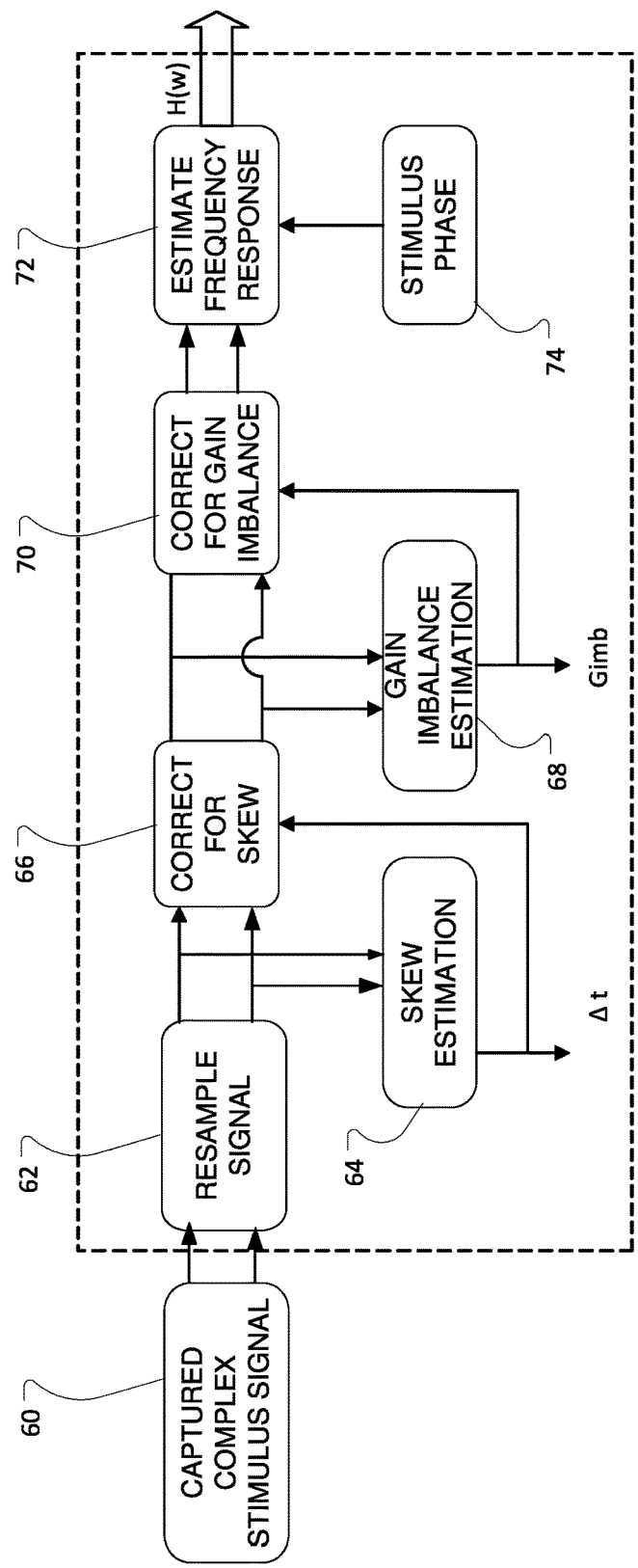
FIG. 4 shows an embodiment of a pre-compensation coefficients estimation block.

FIG. 4 shows an embodiment of characterizing the baseband signal. Before performing an FFT (Fast Fourier Transform) on the captured signals, it is important to make sure the frequency bins of the generated tones fall on the integer bins of the FFT output. If the duration of the signal required for frequency analysis (1*n/frequency resolution of the tones, where n is an integer) is not an integer number of samples, the bins will fall on a non-integer index. This is known as the picket fence effect.

One common method to remedy the picket fence effect is to use time domain windowing such as a Hanning or flat top window, on the captured waveform 62. This works well with the magnitude response, but distorts the phases. Using adjacent bins to calculate the power and correct for phase distortion does not help because of the intermodulation distortion (IMD) components in the frequency response. To solve this issue, the embodiments here resample the captured waveforms at 62 to obtain integer samples and an integer index for frequency bins of interest. This is what is meant by adjusting the sampling rate as necessary.

For example, if the duration of the generated waveform from the AWG/AWGs is represented by D, and the sampling rate of the test instrument or scope is represented by $F_{scope}$, then the number of samples required for analysis (Na) would be:

$$Na = D*F_{scope}.$$

When Na is an integer, the sampling rate used for analysis ($F_{analyzer}$) is equal to the sampling rate of the test instrument:

$$F_{analyzer} = F_{scope}.$$

But, if Na is not an integer, then a new sampling rate can be calculated as, $F_{analyzer}$=Round (Na)/D. The captured waveform can then be resampled based on $F_{analyzer}$, such as by a factor of $F_{analyzer}/F_{scope}$. One should note that the re-sampler might add its own artifacts. But if the captured sampling rate ($F_{analyzer}$) is much larger the input bandwidth of the signal, the artifacts are minimized Next, the skew and the gain imbalances are estimated and corrected, before the channel response is estimated.

Skew between the channels can be obtained at 64 by using the resampled real (I) and imaginary (Q) signals that were captured from the scope. The captured signals are independently cross correlated with the real and imaginary components of a reference signal. By observing the peak energy of the cross-correlated data, the lag for each channel can be determined with respect to the reference signal's I or Q component. The skew between the channels can be estimated by determining the difference in the lag between the I channel and the Q channel.

To obtain a higher resolution of skew estimation, the captured signals may first be resampled again, using a higher sampling rate referred to as $F_{skewanalysisrate}$. For example, to obtain a picosecond of resolution, the captured signal theoretically should be sampled at a rate of 1,000 GS/s. The maximum skew that can be estimated is also limited by the frequency resolution between the individual tones in the multi-tone signal, since the cross correlation peaks would repeat every cycle for the duration of the waveform. Increasing the frequency resolution, such as by lowering the minimum frequency, will increase the maximum skew that can be estimated. The reference signal for cross correlation is created using same phase values as the stimulus signal, but with the same sampling rate as the resampled captured signal, $F_{skewanalysisrate}$.

If $x(n)$ represents the complex signal represented by the captured I and Q signals, which were captured at a sample rate of $F_{analyzer}$ and $x'(m)$ is the resampled captured signal, with a new sampling rate of $F_{skewanalysisrate}$. $x'_r(m)$ and $x'_i(m)$, be the real and imaginary part of the resampled captured signal. Let $r(m)$ be the reference signal created with sampling rate of $F_{skewanalysisrate}$ and let $r_r(m)$ and $r_i(m)$, be the real and imaginary part of $r(m)$.

I Channel Index:

$$C_{xr,rr}(k) = \Sigma x'_r(m) * r_n(m-k)$$

$$C_{peakreal} = \max(abs(C_{xr,rr}(k)))$$

$$Index_{real} = \text{Index of } C_{peakreal} \text{ in } C_{xr,rr}(k)$$

Q Channel Index:

$$C_{xi,ri}(k) = \Sigma x'_i(m) * r_i(m-k)$$

$$C_{peakimag} = \max(abs(C_{xi,ri}(k)))$$

$$Index_{imag} = \text{Index of } C_{peakimag} \text{ in } C_{xi,ri}(k).$$

The estimated skew between the I and Q channels $(\Delta t) = (Index_{imag} - Index_{real}) F_{skewanalysisrate}$. Based on the estimated channel skew, the skew in the index ($\Delta$Index) can be estimated as $(\Delta t)*F_{analyzer}$. Once the skew has been estimated, it can be used to adjust the imaginary component of $x(n)$, to obtain skew-adjusted $x''(n)$ at 66:

If $x(n) = x_r(n) + jx_i(n)$, $$x''(n) = x_r(n) + jx_i(n - ((\Delta Index))$$

By using this approach, fractional delay filters can be applied to correct for the skew. This results in a better resolution than the signal sampled at $F_{analyzer}$.

Gain imbalance refers to a difference in gain between the I and Q paths of the signals. If the ratio of gain between the I channel and the Q channel is not equal to 1, this will result in distorted constellation plot. The gain imbalance is estimated at 68 using the skew-corrected multi-tone signal. The gain imbalance is estimated by comparing the gain ratio between the I and Q components in the reference signal to the gain ratio of the I and Q signals in the skew corrected signal.

$IQ$ Gain ratio in the reference signal =

$$\frac{E(\text{real(normalized reference signal)})}{E(\text{imaginary(normalized reference signal)})}$$

$IQ$ Gain ratio in the skew corrected signal =

$$\frac{E(\text{real(normalized skew corrected signal)})}{E(\text{imaginary(normalized skew corrected signal)})}$$

where E is the expected value. In this context, the expected value represents the average value over the length of the samples.

Gain imbalance $(G_{imb})$ =

$$\left\{\left\{\frac{(IQ \text{ Gain ratio in skew corrected signal})}{(IQ \text{ Gain ratio in reference signal})}\right\} - 1\right\}.$$

Gain imbalance can now be corrected at 70 by applying $G_{imb}$ to the real and imaginary portions of $x''(n)$ to obtain the gain and skew-corrected signal $x'''(n)$, as shown in the following equation:

$$x'''(n) = x''_r(n) * \left\{1 + \left\{\frac{Gimb}{(2 + Gimb)}\right\}\right\} + j * x''_i(n) * \left\{1 - \left\{\frac{Gimb}{(2 + Gimb)}\right\}\right\}.$$

Channel frequency response is now estimated at 72 using $x'''(n)$. A time domain window is applied on $x'''(n)$ to smooth its frequency response. Frequency domain analysis is done by performing a Fast-Fourier Transform (FFT) on the time-windowed version of $x'''(n)$.

The relative magnitude between all of the tones within $x'''(n)$ is obtained. Group delay distortion is obtained by comparing the phases of the tones within $x'''(n)$ with the phases in the stimulus signal and removing the constant group delay or linear component in the phase values. Pre-compensation coefficients are obtained by taking the inverse response.

$$X(w) = F(x'''(n))$$

$$H(w) = \frac{1}{X(w)}.$$

The impulse response ($h(m)$) is obtained from $H(w)$ using a frequency sampling method.

Figure 5:
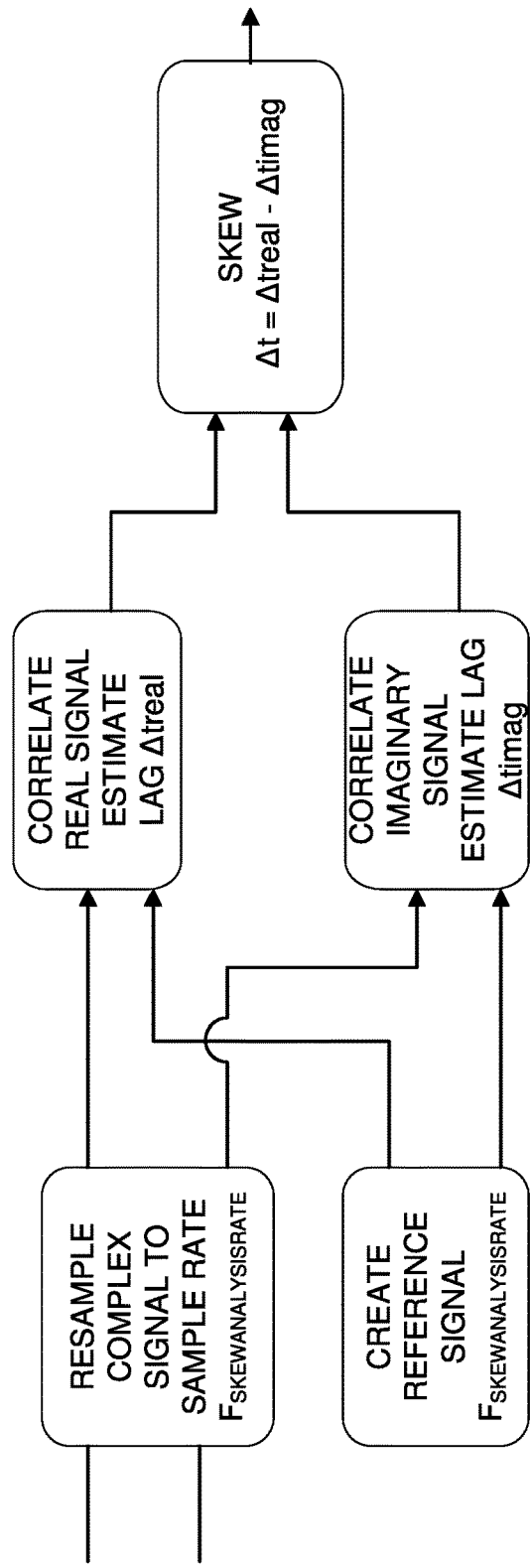
FIG. 5 shows an embodiment of a skew estimation block.

A user defined baseband (IQ) waveform, $y(n)$ can be corrected for skew by using the estimated skew $\Delta t$, obtained using the method described above at 74 in FIG. 4, and shown in more detail in FIG. 5. Skew adjustment can be performed by circularly shifting the imaginary (Q) component of $y(n)$ (represented as $y_i(n)$) by $\Delta t$. Fractional delay filters can be used to shift samples by less than a whole sample. As a result, skew-corrected signal $y'(n)$ can be obtained, as represented in the following equation:

$$y'(n) = y_r(n) + jy_i(n - ((-\Delta t))$$

Gain imbalance $G_{imb}$ is corrected in both the real and imaginary parts of the signal $y'(n)$ by using following equation:

$$y''(n) = y'_r(n) * \left\{1 + \left\{\frac{-Gimb}{(2+(-Gimb))}\right\}\right\} + j * y'_i(n) * \left\{1 - \left\{\frac{(-Gimb)}{(2+(-Gimb))}\right\}\right\}.$$

The channel frequency response is corrected by applying the inverse complex valued impulse response filter h(m) on y"(n), as shown in the following equation:

$y'''(n) = y''(n)$ convolve with $h(m)$.

In this manner, the system used to test a device can be characterized and the signals generated can be pre-compensated using a more accurate and automatic process than previously available.

Although specific embodiments of the invention have been illustrated and described for purposes if illustration, it will be understood that various modifications may be made without departing from the spirit and scope of the invention.

What is claimed is:

1. A test and measurement system, comprising:
   a signal creation tool to generate a complex-valued stimulus signal;
   at least one waveform generator to receive the stimulus signal and produce at least one pair of baseband signals;
   a test instrument to capture the at least one pair of baseband signals and produce captured baseband signals;
   a pre-compensation coefficients estimation block to receive the at least one pair of captured baseband signals, characterize the at least one pair of captured baseband signals and generate pre-compensation coefficients, wherein to characterize the at least one pair of captured baseband signals comprises estimating a skew between each of the signals in each of the at least one pair of baseband signals by cross correlating a pair of reference signals with the at least one pair of baseband signals; and
   a pre-compensation block to apply the pre-compensation coefficients to the complex-valued stimulus signal to be applied to a device under test.

2. The test and measurement system of claim 1, wherein the pre-compensation block resides in one of either the waveform generator or the test instrument.

3. The test and measurement system of claim 1, wherein the signal creation tool resides in one of either the waveform generator or the test instrument.

4. The test and measurement system of claim 1, wherein the pre-compensation coefficients estimation block resides in one of either the waveform generator or the test instrument.

5. The test and measurement system of claim 1, wherein the test instrument is structured to re-sample the baseband signals to obtain integer samples.

6. The test and measurement system of claim 1, wherein the at least one waveform generator comprises one waveform generator with two channels for each pair of baseband signals present in the system.

7. The test and measurement system of claim 1, wherein the at least one waveform generator comprises one waveform generator for each baseband signal in each pair of baseband signals.

8. A method of characterizing a test system, comprising:
   generating a multi-tone stimulus signal;
   producing at least one pair of baseband signals form the multi-tone stimulus signal;
   capturing the at least one pair of baseband signals with a test instrument;
   characterizing the at least one pair of baseband signals to generate pre-compensation coefficients, wherein characterizing the at least one pair of baseband signals comprises estimating a skew between each of the signals in each of the at least one pair of baseband signals by cross correlating a pair of reference signals with the at least one pair of baseband signals; and
   applying the pre-compensation coefficients to signals applied to a device under test.

9. The method of claim 8, wherein capturing the at least one pair of baseband signals comprises sampling the pair of baseband signals.

10. The method of claim 9, further comprising adjusting a sampling rate to capture the at least one pair of baseband signals to obtain integer samples.

11. The method of claim 8, wherein characterizing the at least one pair of baseband signals also comprises estimating a gain imbalance between each of the signals in each of the at least one pair of baseband of baseband signals.

12. The method of claim 11, wherein estimating a gain imbalance between each of the signals comprises comparing a gain ratio of a pair of reference signals to the at least one pair of baseband signals.

13. The method of claim 8, wherein characterizing the at least one pair of baseband signals also comprises determining a frequency response of the signals.

14. The method of claim of 13, wherein determining a frequency response of the signals comprises:
   applying a time domain window to a skew adjusted, gain balanced, input signal to produce a time-windowed version of the input signal;
   performing a Fast Fourier Transform on the time-windowed version of the input signal to generate a frequency response; and
   taking an inverse of the frequency response to obtain pre-compensation coefficients.

* * * * *